(12) United States Patent
Florencio

(10) Patent No.: US 6,449,394 B1
(45) Date of Patent: Sep. 10, 2002

(54) PACKING VARIABLE-LENGTH CODE BITS AT FIXED POSITIONS

(75) Inventor: Dinei A. Florencio, Redmond, WA (US)

(73) Assignees: Sarnoff Corporation, Princeton, NJ (US); Motorola Inc., Schaumburg, IL (US)

(*) Notice: Subject to any disclaimer, the term of this patent is extended or adjusted under 35 U.S.C. 154(b) by 0 days.

(21) Appl. No.: 09/351,062

(22) Filed: Jul. 9, 1999

(51) Int. Cl.[7] .................................................. G06K 9/36
(52) U.S. Cl. ......................................... 382/246; 341/67
(58) Field of Search .................................. 382/246, 245, 382/244; 341/55, 59, 65, 67; 358/261.1, 427, 431

(56) References Cited

U.S. PATENT DOCUMENTS

| | | | |
|---|---|---|---|
| 5,297,220 A | * 3/1994 | Nomizu | 382/56 |
| 5,471,207 A | 11/1995 | Zandi et al. | 341/107 |
| 6,243,496 B1 | * 6/2001 | Wilkinson | 382/245 |
| 6,304,676 B1 | * 10/2001 | Mathews | 382/246 |

* cited by examiner

*Primary Examiner*—Yon J. Couso
(74) *Attorney, Agent, or Firm*—William J. Burke

(57) ABSTRACT

A conventional variable-length codebook is converted into a modified codebook in which each symbol is represented by the same number of bits, but at least one symbol can be represented by at least two different code words. Such symbols therefore may be said to have redundant bits, which may then be used to encode other symbols, thereby achieving a degree of data compression. By using fixed-length code words, the positions of code words in the resulting encoded data stream are known a priori. As a result, the encoded data can decoded in parallel. The present invention provides both the data compression advantages of variable-length encoding schemes and the ability to perform parallel decoding processing of fixed-length encoding schemes. The present invention can be embodied in either lossless or lossy implementations.

14 Claims, 2 Drawing Sheets

PACKING VARIABLE-LENGTH CODE BITS AT FIXED POSITIONS

BACKGROUND OF THE INVENTION

1. Field of the Invention

The present invention relates to data compression, and, in particular, to variable-length coding schemes.

2. Description of the Related Art

Variable-length (VL) codes are an important part of several data compression algorithms. For example, some conventional video compression algorithms, such as those based on an MPEG (Moving Picture Experts Group) standard, apply variable-length coding to run-length-encoded data that is generated by (1) applying a transform, such as a discrete cosine transform (DCT), to blocks of either raw pixel data or motion-compensated interframe pixel difference data, (2) quantizing the resulting blocks of transform coefficients, and (3) run-length encoding the resulting blocks of quantized coefficients to generate the run-length-encoded data that are then variable-length encoded.

In conventional non-variable-length coding, symbols are represented by fixed-length data(,i.e., data having the same number of bits for all symbols). For example, symbols corresponding to the decimal integers 0 through 255 may be represented by the 8-bit binary values (00000000) through (11111111), respectively, where each 8-bit binary value is a fixed-length (i.e., 8-bit) code word representing a different integer.

In variable-length coding, a set of symbols is represented by a set of VL code words having differing numbers of bits. To achieve data compression, VL code words having fewer bits are preferably assigned to symbols that occur more frequently. For example, Table I shows a codebook of Huffman-type VL codes that may be used to efficiently represent integer data in which the frequency of occurrence of the integers decreases as the magnitude of the integer increases. In general, a codebook is a table representing a mapping between symbols and their corresponding code words. In this specification, the terms "code" and "code word" are used interchangeably.

TABLE I

HUFFMAN-TYPE VARIABLE-LENGTH CODEBOOK

| VL codes | Integers |
|---|---|
| (1XX) | 0–3 |
| (01XX) | 4–7 |
| (001XXX) | 8–15 |
| (0001XXXX) | 16–31 |
| (00001XXXXX) | 32–63 |
| (000001XXXXXX) | 64–127 |
| (0000001XXXXXXX) | 128–255 |

Each VL code in Table I comprises a prefix and one or more free bits. A prefix is a set of one or more bits (in Table I, a "1" preceded by zero, one, or more "0"s) that identifies how many total bits are in that code word, while the free bits distinguish between the different code words having the same total number of bits. In Table I, "X" represents a free bit in a VL code. A free bit corresponds to either a 0 or a 1. Thus, for example, the four VL codes represented by (1XX) in Table I correspond to:

the VL code (100) representing the integer 0,
the VL code (101) representing the integer 1,
the VL code (110) representing the integer 2, and
the VL code (111) representing the integer 3;
and analogously for the other codebook entries.

When the codebook of Table I is used to encode a set of integers 0–255 having at least the general tendency that larger integers occur less frequently than smaller integers, the average number of bits used to represent each integer will be smaller than 8, the number of bits in the fixed-length binary representation, thereby achieving an overall reduction in the number of bits used to represent the entire set of integer data as compared to using the fixed-length 8-bit binary codes.

Because the number of bits can vary from VL code to VL code in variable-length encoded data, in conventional VL coding schemes, variable-length encoded data must be decoded sequentially. The dependence of the bit position of any given VL code word on the previous VL code words increases the complexity and latency of the process of decoding VL encoded data. These disadvantages of VL coding do not occur with fixed-length coding schemes, where the bit positions of all fixed-length code words are known a priori. As a result, parallel processing techniques can be easily applied to the decoding of fixed-length encoded data.

SUMMARY OF THE INVENTION

The present invention is directed to a coding technique that addresses the problems of complexity and latency in prior-art variable-length coding that result from the dependence of the bit position of each VL code word in a sequence of VL encoded data on the previous VL code words. The present invention provides a simple and efficient way of merging the advantage of compression efficiency of variable-length coding with the advantage of known bit position of fixed-length coding. The present invention enables significant improvement in the implementation of decoders for encoded data generated according to the present invention, including the use of parallel decode processing.

In one embodiment, the present invention is a method for compressing an original stream of symbols into an encoded stream, comprising the steps of:

(a) encoding m symbols of the original stream of symbols using a codebook into m code words of the encoded stream, wherein:

the m symbols comprise one or more symbol values of a complete set of symbol values;

the codebook represents a mapping of the complete set of symbol values into a set of fixed-length code words, wherein at least one symbol value in the complete set of symbol values corresponds to two or more different code words in the codebook, each of the two or more different code words comprising at least one redundant bit; and the m code words appear at regular intervals in the encoded stream based on the fixed length of the code words; and (b) encoding at least one additional symbol into the bits of the encoded stream corresponding to m code words.

In another embodiment, the present invention is a method for decoding an encoded stream into a decoded stream of symbols, comprising the steps of:

(1) decoding m code words in the encoded stream, wherein the m code words were generated by:

(a) encoding m symbols of an original stream of symbols using a codebook into the m code words of the encoded stream, wherein:

the m symbols comprise one or more symbol values of a complete set of symbol values;

the codebook represents a mapping of the complete set of symbol values into a set of fixed-length code words, wherein at least one symbol value in the complete set of symbol values corresponds to two or more different code words in the codebook, each of the two or more different code words comprising at least one redundant bit and a set of bits corresponding to a VL code word of a variable-length (VL) codebook, the VL code word being identical for each of the two or more different code words corresponding to the at least one symbol value; and the m code words appear at regular intervals in the encoded stream based on the fixed length of the code words; and (b) encoding at least one additional symbol into the bits of the encoded stream corresponding to m code words, if the m code words comprise a sufficient number of redundant bits to encode the at least one additional symbol; and (2) decoding the at least one additional symbol from the bits of the encoded stream corresponding to the m code words.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
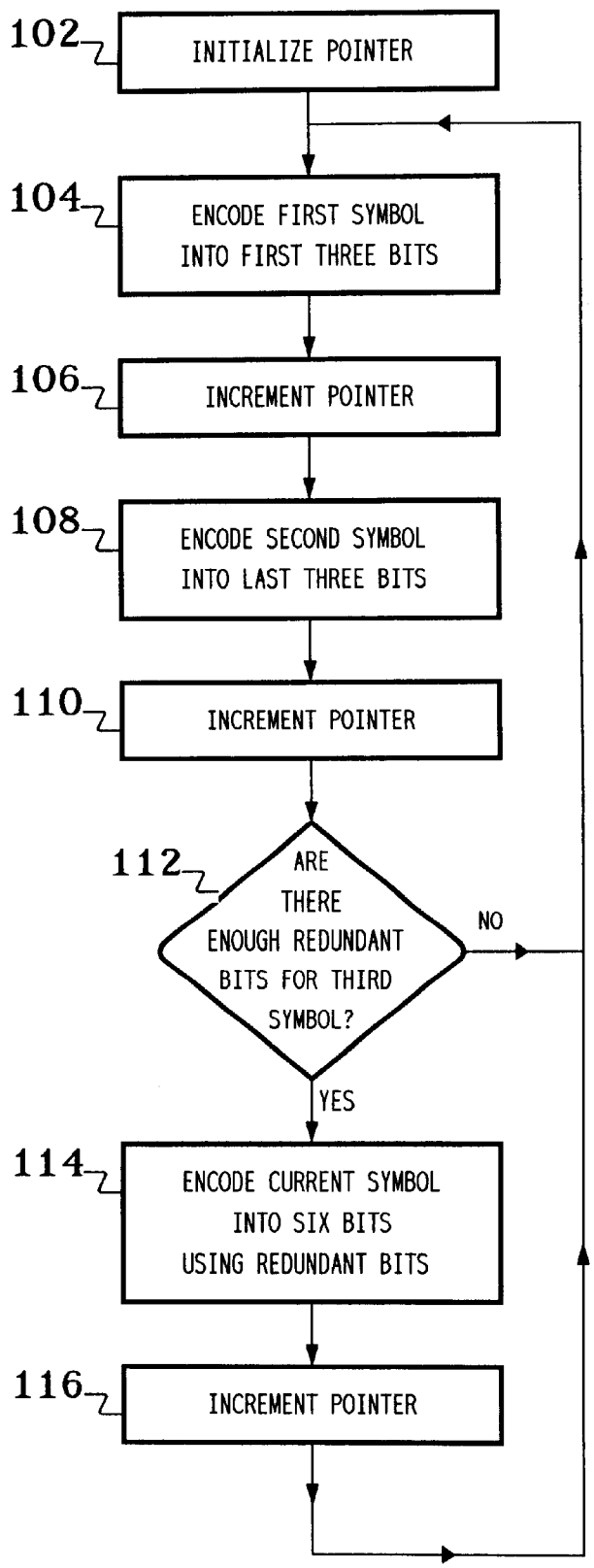
FIG. 1 shows a flow diagram of symbol-encoding processing corresponding to the encoding pseudocode, according to one possible lossless implementation of the present invention.

The present invention is directed to coding techniques in which at least two codes having the same total number of bits are assigned to a single symbol, The codes are assigned so that one or more free bits in these "redundant" codes are used to represent some other symbol in the stream.

FIRST EXAMPLE

Two-Bit Codes for a Three-Symbol Set

The invention is first illustrated using a relatively simple example. Assume that the data to be encoded is made up of three symbols: "A," "B," and "C." Table II shows a conventional VL codebook in which the symbols "A," "B," and "C" are represented by the VL code words (0), (10), and (11), respectively.

TABLE II

CONVENTIONAL VARIABLE-LENGTH CODEBOOK

| VL codes | Symbols |
| --- | --- |
| 0 | A |
| 10 | B |
| 11 | C |

Using the codebook of Table II, the symbol sequence {A, B, A, C} would be VL coded as (0, 10, 0, 11) or simply (010011). Without prior knowledge of the symbol sequence, the bit position of the VL code corresponding to each symbol in the encoded sequence (010011) would not be known (except for the very first symbol) unless and until each preceding symbol had been decoded (or at least processed to a sufficient degree to determine the length of each preceding VL code). This implies that the decoding processing must be done in a sequential manner, precluding the use of parallel processing techniques to achieve decoding efficiency.

Table III shows a codebook for the symbols "A," "B," and "C," according to one embodiment of the present invention. The codes of Table III were constructed from the VL codes of Table II by adding a sufficient number of "redundant" bits Y to make all codes have the same fixed length, where each redundant bit Y can be either a "0" or a "1." As indicated in Table III, the symbol "A" may be represented by either the two-bit code (00) or the two-bit code (01).

TABLE III

| CODEBOOK | |
| --- | --- |
| Codes | Symbols |
| 0Y | A |
| 10 | B |
| 11 | C |

According to one embodiment of the present invention, the first three symbols {A, B, A} in the sequence {A, B, A, C} would be coded as $(0Y_1, 10, 0Y_2)$ using the codebook of Table III, where $Y_1$ and $Y_2$ identify the two different redundant bits. The fourth symbol could then be coded using the two redundant bits $Y_1$ and $Y_2$, where the first redundant bit $Y_1$ corresponds to the first bit in the two-bit code or the fourth symbol and the second redundant bit $Y_2$ corresponds to the second bit in the two-bit code for the fourth symbol. Since the fourth symbol in the sequence {A, B, A, C} is the symbol "C," which is represented in Table III by the two-bit code (11), the four-symbol sequence {A, B, A, C} would be represented by the six-bit code sequence (011001) using the codebook of Table III. Thus, even though Table III defines two-bit codes for all symbols, the four symbols in the sequence {A, B, A, C} can be represented using only six bits, according to the present invention.

The code sequence (011001) can be decoded in a sequential manner, similar to conventional VL decoding, by decoding the first three two-bit code words in sequence, while accumulating the redundant bits in the code words used for the symbol "A" in order to decode the fourth code word.

Alternatively, the code sequence (011001) can be decoded in parallel. In particular, the first three symbols can be decoded in parallel, because their bit positions are known a priori due to the fact that they are all encoded using two-bit code words. Moreover, as described in the next paragraph, the fourth symbol can also be decoded in parallel with the decoding of the first three symbols.

Let each six-bit code sequence be represented generally as (h i j k l m), wherein each letter represents a different bit in the code sequence. The first bit d1 of the fourth code word can be decoded as follows:

d1=(($\underline{h}$ AND $i$)XOR($j$ AND $k$), and the second bit d2 of the fourth code word can be decoded as follows:

d2=(($\underline{i}$ AND $k$)XOR($\underline{l}$ AND $m$), where XOR represents the logical exclusive-OR function, and underscoring represents logical negation (where $\underline{0}$=1 and $\underline{1}$=0).

For the previous example of the six-bit code sequence (011001), d1=((h̲ AND i)XOR(j AND k)=((1 AND 1)XOR(0 AND 0)=(1 XOR 0)=1 and d2=((j̲ AND k)XOR(l̲ AND m)=((0 AND 0)XOR(1 AND 1)=(0 XOR 1)=1.

As such, the fourth code word (d1 d2)=(11), which is the code word for the symbol "C". This decode processing can be implemented in parallel with the decoding of the first three symbols to decode all four symbols in the four-symbol sequence {A, B, A, C} at the same time from the six-bit code sequence (011001).

The above coding scheme based on Table III in which four symbols are encoded into six bits assumes that there are at least two occurrences of symbol "A" in the first three symbols of a four-symbol sequence. Under this assumption, there will be at least two redundant bits with which to encode the fourth symbol. This coding scheme works best when the probability of occurrence of the symbol "A" is twice as likely as those of symbols "B" and "C" combined (i.e., p(A)=p(B)+p(C)). If the probability of occurrence of symbol "A" is less than that, then the coding scheme can be adjusted accordingly, for example, encoding a five-symbol sequence into eight bits.

In any case, each particular coding scheme still needs to account for each of the other possible sequences of symbols, including those that do not provide a sufficient number of redundant bits to encode an additional symbol. For example, four-symbol sequences having fewer than two occurrences of symbol "A" in the first three symbols would not provide the two redundant bits needed to encode accurately each possible value of the fourth symbol within the first six bits of encode data using the codebook of Table III. The handling of these other possible sequences will be explored in greater detail with regard to the following example.

SECOND EXAMPLE

Three-Bit Codes for a Four-Symbol Set

As a second example of an embodiment of the present invention, consider the conventional variable-length codebook of Table IV for the four symbols "A," "B," "C," and "D."

TABLE IV

CONVENTIONAL VARIABLE-LENGTH CODEBOOK

| VL codes | Symbols |
| --- | --- |
| 0 | A |
| 10 | B |
| 110 | C |
| 111 | D |

This conventional VL codebook can be converted into a codebook according to the present invention by adding enough redundant bits to ensure that each code word has three bits, as shown in Table V. According to the codebook of Table V, the code for the symbol "A" has two redundant bits Y. As such, the symbol "A" can be represented by any of the four code words (000), (001), (010), or (011). Similarly, the code for the symbol "B" has one redundant bit Y, and therefore the symbol "B" can be represented by either of two code words (100) or (101).

TABLE V

CODEBOOK

| Codes | Symbols |
| --- | --- |
| 0YY | A |
| 10Y | B |
| 110 | C |
| 111 | D |

Assume that the symbol data to be encoded is such that p(A), the probability of occurrence of symbol "A" is 0.5, p(B)=0.25, and p(C)=p(D)=0.125. Since the code for "A" has two redundant bits and the code for "B" has one redundant bit, on average, there will be about 1.25 redundant bits per code word for a typical sequence of symbols. Moreover, the second bit of each word has around 50% probability of being a redundant bit, while the third (i.e., last) bit of each word has around 75% probability of being a redundant bit. As was the case in the coding scheme based on Table III, these redundant bits can be used to encode other symbols in the sequence.

In particular, the codebook of Table V can be used to encode a sequence of three symbols {S1, S2, S3} using six bits of encoded data, where the bits of S3 are embedded in the two three-bit code words for S1 and S2. Let:

(b1 b2 b3) represent the three bits of the lowest (i.e., smallest binary value) code word for the first symbol S1, (b4 b5 b6) represent the three bits of the lowest code word for the second symbol S2, (r1 r2 r3) represent the three bits of the lowest code word for the third symbol S3, and (c1 c2 c3 c4 c5 c6) represent the six bits of encoded data for the symbol sequence {S1, S2, S3}

As indicated in Table V, (000) is the lowest code word for the symbol "A," (100) for "B," (110) for "C," and (111) for "D." According to one embodiment of the present invention, three symbols {S1, S2, S3} can be encoded using the following encoding pseudocode:

```
1   Set (c1 c2 c3) = (b1 b2 b3);
2   Set (c4 c5 c6) = (b4 b5 b6);
3   If b1 == 0
4      Set c6 = b6 OR (NOT (b4 AND b5) AND (b5 XOR r3));
5      Set c3 = b3 OR (c6 XOR r2);
6      Set c2 = b2 OR (c3 XOR r1);
7   Else
8      Set c3 = b3 OR (NOT (b1 AND b2) AND (b2 XOR r1));
9      Set c6 = b6 OR (c3 XOR r2);
10     Set c5 = b5 OR (c6 XOR r3)
```

This pseudocode can be implemented either in software or in hardware by unwrapping the "if" statements into simple logic.

Tables VIA–B show the six bits of encoded data (c1 c2 c3 c4 c5 c6) that result from applying the encoding pseudocode to the 64 different possible three-symbol combinations of the four symbols.

The resulting six-bit code sequence (c1 c2 c3 c4 c5 c6) can be decoded into the three symbols {S1, S2, S3} according to the following decoding pseudocode:

| | |
|---|---|
| 1 | Decode the first symbol S1 from (c1 c2 c3); |
| 2 | Decode the second symbol S2 from (c4 c5 c6); |
| 3 | Decode the third symbol S3 = (d1 d2 d3) where: |
| 4 | d1 = c2 XOR c3; |
| 5 | d2 = c3 XOR c6; |
| 6 | d3 = c5 XOR c6 |

As in the previous example, all three symbols can be decoded in parallel, and the processing can be implemented either in software or in hardware.

Tables VIA–B also show the three bits of decoded data (d1 d2 d3) that result from applying the decoding pseudocode to the 64 different sets of six-bit encoded data generated using the encoding pseudocode. An "x" adjacent to a bit value in the encoded data indicates a situation in which the "wrong" bit value resulted from applying the encoding pseudocode to the nine bits of the original symbol sequence. Similarly, an "x" adjacent to a bit value in the decoded data indicates a situation in which the "wrong" bit value resulted from applying the decoding pseudocode to the six bits of the encoded data.

For example, for the input symbol sequence {A, C, C}, the encoding pseudocode would generate six bits of coded data as (001110), while the decoding pseudocode would then generate three bits of decoded data as (111). The first three bits of encoded data are (001), which is one of the four code values for the symbol "A." The second three bits of encoded data are (110), which is the code value for the symbol "C." This means that the first two steps of the decoding pseudocode would yield the correct values for the first two symbols in the original three-symbol sequence. However, the three bits of decoded data for the third symbol are (111), which corresponds to the symbol "D," and not "C," which was the third symbol in the original sequence. Thus, the combination of the encoding and decoding pseudocodes do not yield the correct decoded sequence for the input sequence {A, C, C}.

As another example, for the input symbol sequence {B, B, D}, the encoding pseudocode would generate six bits of coded data as (101110), while the decoding pseudocode would then generate three bits of decoded data as (111). The first three bits of encoded data are (101), which is one of the two code values for the symbol "B." The second three bits of encoded data are (110), which is the code value for the symbol "C." The three bits of decoded data for the third symbol are (111), which corresponds to the symbol "D." Thus, in this case, the first and third symbols would be decoded correctly, but the second symbol would be decoded as a "C," instead of the correct symbol "B."

There are still other combinations for which two of the three symbols would be decoded incorrectly. For example, the input symbol sequence {D, C, B} would be incorrectly decoded as the sequence {D, D, A}, using the encoding and decoding pseudocodes.

Notwithstanding these examples of combinations for which the encoding and decoding pseudocodes do not reproduce the correct three-symbol sequence, inspection of Tables VIA–B reveals that many combinations do in fact encode and decode to the correct result. In particular, all three-symbol combinations starting with {A, A}, {A, B}, or {B, A} will encode and decode correctly no matter what the value of the third symbol. These are combinations in which the first two symbols have a total of at least three redundant bits, which may then be used to encode the third of the three-bit symbols.

In addition, there are many other combinations of symbols that produce correct results even though there appear not to be a sufficient number of redundant bits. For example, the input symbol sequence {C, A, D} happens to encode and decode correctly, even though there are only two redundant bits among all three symbols.

The results in Tables VIA–B suggest a number of different possible implementations for the coding scheme embodied in the encoding and decoding pseudocodes. One category of implementations corresponds to lossless coding, in which the decoded symbol sequence is guaranteed to be identical to the original input symbol sequence. Another category corresponds to lossy coding, in which the requirement for accurate decoding is relaxed.

One possible lossy implementation is to apply the encoding and decoding pseudocode to each and every three-symbol sequence in a symbol stream. The resulting decoded symbol stream will most probably not be identical to the original input symbol stream, but, depending on the application, the errors may be tolerable. For example, in a video compression application, the coding/decoding errors may not be perceptible to the human eye. Moreover, if the frequency of occurrence of the "good" combinations (i.e., those that encode and decode correctly) far exceeds the frequency of occurrence of the "bad" combinations (i.e., those that encode and decode incorrectly) (as should be the case in which such a coding scheme is employed), then the errors will be even more tolerable.

One way to achieve lossless coding under the present invention would be to determine, at the encoder, whether the three-symbol sequence corresponded to a "good" combination or a "bad" combination, before encoding the symbols. If the three symbols corresponded to a "good" combination, then the encoding pseudocode can be safely applied to generate the corresponding six bits of encoded data. If, however, the three symbols corresponded to a "bad" combination, then that set of three symbols would be treated differently by the encoder. The decoder would also apply some type of testing during the decoding processing to determine whether the original three-symbol sequence was a "good" combination or a "bad" combination. The encoding and decoding processing of FIGS. 1 and 2, respectively, corresponds to such a lossless implementation.

FIG. 1 shows a flow diagram of symbol-encoding processing corresponding to the encoding pseudocode, according to one possible lossless implementation of the present invention. Depending on the situation, the processing of FIG. 1 encodes either the next two symbols or the next three symbols in a symbol sequence into six bits of encoded data. The pointer used in FIG. 1 identifies the next symbol in the symbol sequence.

In particular, after the pointer has been initialized in step 102 of FIG. 1, the first symbol S1 in the current three-symbol sequence {S1, S2, S3} is encoded into the first three bits (c1 c2 c3) of the six-bit code sequence (step 104 and line 1 of the encoding pseudocode), the pointer is incremented (step 106), the second symbol S2 is encoded into the last three bits (c4 c5 c6) (step 108 and line 2), and the pointer is again incremented (step 110). If the first two symbols S1 and S2 are both "A" or if one is an "A" and the other one is a "B," then there will be enough redundant bits to encode the third symbol S3 no matter whether S3 is an "A," "B," "C," or "D." If so (as determined in step 112), then the third symbol S3 is encoded into the six bits of encoded data using the redundant bits (step 114) and the pointer is again incremented (step 116) before returning to step 104 to process the next set of symbols. The exact encoding procedure depends on whether or not the first symbol S1 is an "A," as presented in lines 4–10 of the encoding pseudocode. Otherwise, if there are not enough redundant bits from encoding the first two symbols (step 112), then the processing returns to step 104 without further incrementing the pointer.

The symbol-encoding processing of FIG. 1 encodes three symbols into six bits of encoded data only if the first two of those three symbols are either {A, A}, {A, B}, or {B, A}. All the other possible combinations (including those other combinations that would be coded correctly using the encoding and decoding pseudocodes) are handled in such a way that only two symbols are encoded into the corresponding six bits of encoded data. In those cases, the next three-symbol sequence begins with the very next symbol in the stream so as not to skip any symbols in the input symbol stream.

Figure 2:
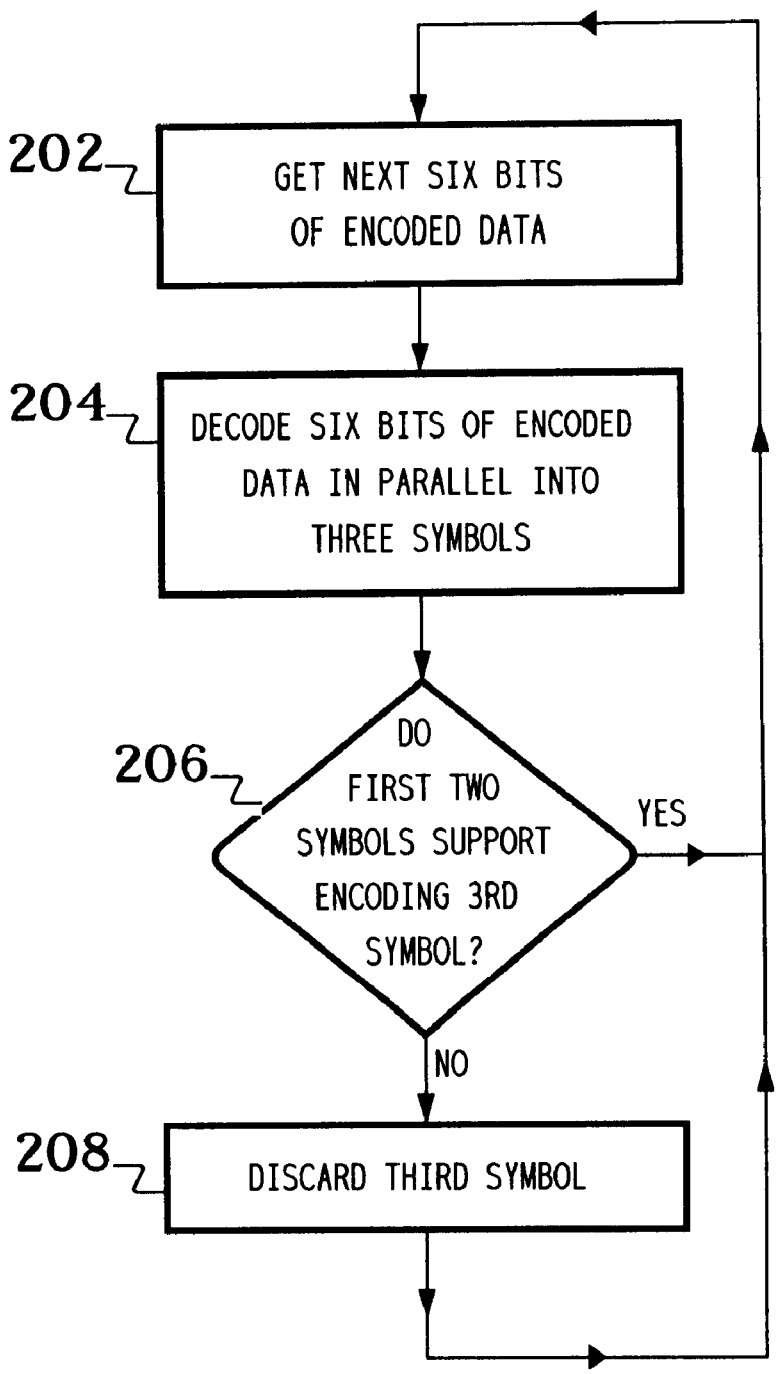
FIG. 2 shows a flow diagram of the symbol-decoding processing corresponding to the decoding pseudocode, according to one possible lossless implementation of the present invention.

FIG. 2 shows a flow diagram of the symbol-decoding processing corresponding to the decoding pseudocode, according to one possible lossless implementation of the present invention. The decoding processing of FIG. 2 is designed to decode the encoded data generated using the encoding processing of FIG. 1. As such, depending on the situation, the processing of FIG. 2 is used to decode each set of six bits of encoded data into either two symbols or three symbols of a decoded symbol sequence.

In particular, after the next six bits of encoded data are retrieved in step 202 of FIG. 2, the three symbols S1, S2, and S3 are decoded in parallel using lines 1, 2, and 3–6 of the pseudocode, respectively (step 204). If the first two symbols S1 and S2 have values (i.e., two "A"s, or an "A" and a "B") that would have provided enough redundant bits to encode the third symbol S3 (step 206), then processing returns to step 202 to decode the next six bits of encoded data. Otherwise, there were not enough redundant bits and the third symbol S3 should be discarded (step 208).

As mentioned earlier, the implementations of FIGS. 1 and 2 correspond to lossless encoding and decoding, respectively, in which the decoded symbol sequence is identical to the original input symbol sequence. The penalty paid for this losslessness is having to verify (e.g., in step 206 of FIG. 2) whether an extra symbol was encoded into each set of encoded data. In alternative, lossy implementations of the present invention, the extra symbol is "encoded" into the bitstream even if there were not enough redundant bits to do so without adversely affecting the ability of a decoder to accurately reconstruct the original symbol sequence. The encoding processing of such a lossy implementation may correspond to FIG. 1 without step 112, while the decoding processing may correspond to FIG. 2 without steps 206 and 208. As a result, the decoding under such a lossy implementation can be performed faster than the decoding of the corresponding lossless implementation. Depending on the requirements of the overall application, decoding speed may be more important than decoding accuracy, and the faster lossy implementation may be preferable to the slower lossless implementation.

In general, the correct decoding of a certain number of codes can always be guaranteed. More precisely, if desired, the correct decoding of the first N/K codes can be guaranteed, where N is the number of bits (for the group) and K is the length of each word. For example, if groups of nine bits are used with three-bit words, the first three codes should always be able to be correctly decoded. The guarantee of perfect decoding of some words may be very useful in certain applications, although, in other applications, it may be more useful to spread the errors among several codes, instead of concentrating errors at the end of each group of bits.

THIRD EXAMPLE

Three-Bit Codes for a Four-Symbol Set

The following provides another example of corresponding coding and decoding schemes according to the present invention for encoding three 3-bit codes for a four-symbol set into six bits of data. These schemes, which are based on the same codebook as the second example shown in Table V, should always decode correctly the first two codes, and, if the "optional" steps are implemented, the scheme should have as many bits correct in the third code as the number of available bits. The pseudocode for the coding scheme is given as follows:

```
1   Set (c1 c2 c3) = (b1 b2 b3);
2   Set (c4 c5 c6) = (b4 b5 b6);
3   If b1 == 0         (=> c2 and c3 are free)
4       if b5 == 0     (=> c6 is free)
5           set c2 = r3 XOR c5;
6           set c3 = r2 XOR c2;
7           set c6 = r1 XOR c5;
8       else           (=> only two bits are free)   /* OPTIONAL */
9           set c2 = r3 XOR c5;                       /* OPTIONAL */
10          set c3 = r2 XOR c2;                       /* OPTIONAL */
11  else
12      if b4 == 0     (=> c5 and c6 are free)
13          if b2 == 0 (=> c3 is free)
14              set c5 = r3 XOR c2;
15              set c3 = r2 XOR c2;
16              set c6 = r1 XOR c5;
17          else       (=> only two bits are free)   /* OPTIONAL */
18              set c5 = r3 XOR c2;                   /* OPTIONAL */
19              set c6 = r1 XOR c5;                   /* OPTIONAL */
20      else                                          /* OPTIONAL */
21          if b5 == 0     (=> c6 is free)            /* OPTIONAL */
22              if b2 == 0 (=> c3 is free)            /* OPTIONAL */
23                  set c3 = r2 XOR c2                /* OPTIONAL */
24                  set c6 = r1 XOR c5                /* OPTIONAL */
25          else                                      /* OPTIONAL */
26              if b2 == 0 (=> c3 is free)            /* OPTIONAL */
27                  set c3 = r2 XOR c2                /* OPTIONAL */
```

The pseudocode for the corresponding decoding scheme is given as follows:

```
1   Decode the first symbol S1 from (c1 c2 c3);
2   Decode the second symbol S2 from (c4 c5 c6);
3   Decode the third symbol S3 = (d1 d2 d3) where:
4       d1 = c5 XOR c6;
5       d2 = c2 XOR c3;
6       d3 = c2 XOR c5
```

Alternative Embodiments

The present invention has been described in the context of two particular examples: the first example in which a three-symbol set is represented by the two-bit codes of Table III and the second example in which a four-symbol set is represented by three-bit codes of Table V. Those skilled in the art will understand that the present invention can be applied in the context of other symbol sets having a greater number of symbols that are represented by longer codes.

The implementations of FIGS. 1 and 2 corresponding to embodiments in which the symbols are encoded and decoded individually. The decoding processing of FIG. 1 may be implemented such that two or three symbols are decoded in parallel, but still each symbol is decoded individually. Those skilled in the art will appreciate that the present invention can also be implemented, for example, using lookup tables that contain representations corresponding to sets of two or more symbols. In such implementations, two or more symbols can be encoded and/or decoded together, for example, using the input and encoded bit sequences as addresses into the corresponding encoding and decoding lookup tables, respectively. Depending on the application, such lookup table techniques may be more useful in the decoding processing than in the encoding processing, which might not need to be implemented in real time.

In general, the encoding and decoding procedures for a particular symbol set and corresponding codebook can be generated using the following guidelines:

(1) Generate the "fixed-length" codes as described earlier in this specification.

(2) Verify the position (and probability) of bits which may become available. In the second and third examples,. c2, c3, c5, and c6 may be available, while c1 and c4 are never available.

(3) Write the decoding expressions, using XOR (and/or other logic) associating different groups of bits to each code bit. In the third example, d1=c5 XOR c6; d2=c2 XOR c3; and d3=c2 XOR c5.

(a) It is best to avoid groups of bits appearing together in several codes.

(b) XOR is preferred over other logic relations because it preserves the information content of the result when one of the bits is fixed.

(4) Write the encoding method. When writing the encoding expressions, identify which bits are actually available (e.g., to generate the "if" statements in the second and third examples). Identify (and encode/freeze) first the bits present in combinations with fewer free bits (e.g., in the third example, when c2, c3 and c6 are free (first case), the encoding scheme starts encoding the expression for r3, because it is the one which has only one free bit.

(5) If desired, the "if" statements can be unwrapped into simple logic (AND/OR statements).

The encoding and decoding schemes of present invention can be implemented for different data compression applications. For example, the present invention can be implemented in conjunction with a variable-length encoder of a video compression algorithm, where the variable-length encoder is able to exploit the existence of redundant bits to keep the total code-length constant for each block of data, thereby enabling both data compression and efficient (e.g., parallel) decoding.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for compressing an original stream of symbols into an encoded stream, comprising the steps of:

(a) encoding m symbols of the original stream of symbols using a codebook into m code words of the encoded stream, wherein:

the m symbols comprise one or more symbol values of a complete set of symbol values;

the codebook represents a mapping of the complete set of symbol values into a set of fixed-length code words, wherein at least one symbol value in the complete set of symbol values corresponds to two or more different code words in the codebook, each of the two or more different code words comprising at least one redundant bit; and the m code words appear at regular intervals in the encoded stream based on the fixed length of the code words; and (b) encoding at least one additional symbol into the bits of the encoded stream corresponding to m code words.

2. The invention of claim 1, wherein the symbols represent video or audio data.

3. The invention of claim 1, wherein the encoded stream has fewer bits than the stream of symbols, thereby enabling the encoded stream to be stored or transmitted more efficiently than the stream of symbols.

4. The invention of claim 1, wherein each of the two or more different code words further comprises a set of bits corresponding to a variable-length (VL) code word of a VL codebook, the VL code word being identical for each of the two or more different code words corresponding to the at least one symbol value.

5. The invention of claim 1, wherein the at least one additional symbol is encoded into the bits of the encoded stream corresponding to m code words, if the m code words comprise a sufficient number of redundant bits to encode the at least one additional symbol.

6. A machine-readable medium, having encoded thereon program code, wherein, when the program code is executed by a machine, the machine implements a method for compressing an original stream of symbols into an encoded stream, comprising the steps of:

(a) encoding m symbols of the original stream of symbols using a codebook into m code words of the encoded stream, wherein:

the m symbols comprise one or more symbol values of a complete set of symbol values;

the codebook represents a mapping of the complete set of symbol values into a set of fixed-length code words, wherein at least one symbol value in the complete set of symbol values corresponds to two or more different code words in the codebook, each of the two or more different code words comprising at least one redundant bit; and the m code words appear at regular intervals in the encoded stream based on the fixed length of the code words; and
(b) encoding at least one additional symbol into the bits of the encoded stream corresponding to m code words.

7. A method for decoding an encoded stream into a decoded stream of symbols, comprising the steps of:
(1) decoding m code words in the encoded stream, wherein the m code words were generated by:
(a) encoding m symbols of an original stream of symbols using a codebook into the m code words of the encoded stream, wherein:
the m symbols comprise one or more symbol values of a complete set of symbol values;
the codebook represents a mapping of the complete set of symbol values into a set of fixed-length code words, wherein at least one symbol value in the complete set of symbol values corresponds to two or more different code words in the codebook, each of the two or more different code words comprising at least one redundant bit and a set of bits corresponding to a VL code word of a variable-length (VL) codebook, the VL code word being identical for each of the two or more different code words corresponding to the at least one symbol value; and
the m code words appear at regular intervals in the encoded stream based on the fixed length of the code words; and
(b) encoding at least one additional symbol into the bits of the encoded stream corresponding to m code words, if the m code words comprise a sufficient number of redundant bits to encode the at least one additional symbol; and
(2) decoding the at least one additional symbol from the bits of the encoded stream corresponding to the m code words.

8. The invention of claim 7, wherein the symbols represent video or audio data.

9. The invention of claim 7, wherein the encoded stream has fewer bits than the decoded stream of symbols, thereby enabling the encoded stream to have been stored or transmitted more efficiently than the decoded stream of symbols.

10. The invention of claim 7, wherein the m symbols are decoded in parallel from the m code words.

11. The invention of claim 10, wherein the m symbols and the at least one additional symbol are decoded in parallel from the m code words.

12. The invention of claim 7, wherein each of the two or more different code words further comprises a set of bits corresponding to a VL code word of a VL codebook, the VL code word being identical for each of the two or more different code words corresponding to the at least one symbol value.

13. The invention of claim 7, wherein the at least one additional symbol is encoded into the bits of the encoded stream corresponding to m code words, if the m code words comprise a sufficient number of redundant bits to encode the at least one additional symbol.

14. A machine-readable medium, having encoded thereon program code, wherein, when the program code is executed by a machine, the machine implements a method for decoding an encoded stream into a decoded stream of symbols, comprising the steps of:
(1) decoding m code words in the encoded stream, wherein the m code words were generated by:
(a) encoding m symbols of an original stream of symbols using a codebook into the m code words of the encoded stream, wherein:
the m symbols comprise one or more symbol values of a complete set of symbol values;
the codebook represents a mapping of the complete set of symbol values into a set of fixed-length code words, wherein at least one symbol value in the complete set of symbol values corresponds to two or more different code words in the codebook, each of the two or more different code words comprising at least one redundant bit and a set of bits corresponding to a VL code word of a variable-length (VL) codebook, the VL code word being identical for each of the two or more different code words corresponding to the at least one symbol value; and
the m code words appear at regular intervals in the encoded stream based on the fixed length of the code words; and
(b) encoding at least one additional symbol into the bits of the encoded stream corresponding to m code words, if the m code words comprise a sufficient number of redundant bits to encode the at least one additional symbol; and
(2) decoding the at least one additional symbol from the bits of the encoded stream corresponding to the m code words.

* * * * *

UNITED STATES PATENT AND TRADEMARK OFFICE
CERTIFICATE OF CORRECTION

PATENT NO. : 6,449,394 B1
DATED : September 10, 2002
INVENTOR(S) : Dinei A.F. Florencio It is certified that error appears in the above-identified patent and that said Letters Patent is hereby corrected as shown below:

<u>Column 13,</u>
Line 5, replace "in" with -- *m* --.
Line 13, replace "in" with -- *m* --.

Signed and Sealed this

Fourteenth Day of January, 2003

JAMES E. ROGAN
*Director of the United States Patent and Trademark Office*